United States Patent
Walter et al.

(10) Patent No.: US 7,095,225 B2
(45) Date of Patent: Aug. 22, 2006

(54) METHOD AND ASSEMBLY FOR DETECTING THE MOTION OF AN ELEMENT

(75) Inventors: Klaus Walter, Bietigheim-Bissingen (DE); Rasmus Rettig, Gerlingen (DE); Christelle Andriot, Ludwigsburg (DE); Ruediger Block, Korntal-Muenchingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/501,062

(22) PCT Filed: Apr. 25, 2003

(86) PCT No.: PCT/DE03/01349

§ 371 (c)(1), (2), (4) Date: Jul. 9, 2004

(87) PCT Pub. No.: WO03/098230

PCT Pub. Date: Nov. 27, 2003

(65) Prior Publication Data

US 2005/0068023 A1 Mar. 31, 2005

(30) Foreign Application Priority Data

May 18, 2002 (DE) .............................. 102 22 206

(51) Int. Cl.
*G01B 7/30* (2006.01)
*G01R 33/02* (2006.01)
*G01R 33/07* (2006.01)

(52) U.S. Cl. ................ 324/244; 324/251; 324/207.25; 324/207.2

(58) Field of Classification Search ................ 324/244, 324/251, 207.2, 207.25
See application file for complete search history.

(56) References Cited

U.S. PATENT DOCUMENTS 5,451,891 A  9/1995 Tanabe
5,523,679 A * 6/1996 Kalb .......................... 324/165

FOREIGN PATENT DOCUMENTS

DE  197 50 304  5/1995
EP  0 544 424 A  6/1993
WO  82/03691  10/1982

* cited by examiner

*Primary Examiner*—Bot LeDynh
(74) *Attorney, Agent, or Firm*—Michael J. Striker

(57) ABSTRACT

A method for detecting the motion of an element relative to a sensor apparatus is proposed, in which a detection of the direction of motion is performed. As a function of the direction of motion, a measurement signal is increased or decreased at predetermined measurement intervals, and only if a predetermined threshold value is exceeded is a direction-of-motion signal generated. Preferably, by means of a counting logic circuit (6), a counter is increased by a binary amount In one direction (2) and the counter (6) is decreased by a binary amount in the respective other direction (3). Upon a detection of measurement signals which as a result of being increased or decreased in a measurement interval do not lead to exceeding of the predetermined amount of the threshold value, vibration of the element is assumed.

7 Claims, 1 Drawing Sheet

METHOD AND ASSEMBLY FOR DETECTING THE MOTION OF AN ELEMENT

BACKGROUND OF THE INVENTION

The invention relates to a method and an apparatus for detecting the motion of an element relative to a sensor apparatus, in particular for detecting the angle of rotation of a rotating element by way of a sensor.

Various embodiments of such sensor apparatuses are already in use, for instance in vehicles. For instance with so-called Hall elements as rpm sensors on the wheels for an anti-lock brake system (ABS), as rpm and phase transducers for engine control, or as steering angle sensors for so-called vehicle dynamics control, and for electrical steering aids.

Among the most essential demands made of these rpm sensors, both in ABS and in the field of engines and transmissions, are as large an air gap as feasible and high immunity to vibration. However, it must be noted that a highly sensitive sensor is intrinsically also highly sensitive to excitation by the vibration that impairs the outcome of measurement and that briefly also causes changes in the directions of rotation.

From German Patent Disclosure DE 197 50 304 A1, for instance, an apparatus for contactless detection of an angle of rotation by means of a pulse wheel is known, in which direction of rotation detection is possible by providing that in one direction of rotation, a change in the spacing of the pulse-tripping elements has been made, thus changing the duty factor.

To minimize the sensitivity of such sensor apparatuses to vibration, in conventional rpm sensors, a variable hysteresis is often also employed. This requires that first the signal amplitudes be measured, and the hysteresis is then adapted flexibly to them. For large input signals, major hysteresis is then selected, while a correspondingly reduced hysteresis is selected for small input signals; that is, when the air gap is small, the amplitude required for switching is increased. A substantial disadvantage of this method is the loss of immunity to air gap impacts during operation, which can briefly cause a major reduction in the signal amplitude. A previously increased hysteresis at the switching point of the sensor, signal loss can then occur in the event of an air gap impact.

Moreover, this method can be employed only once calibration of the sensor has been done, since it is only after calibration that the signal amplitude is known. Immediately after the sensor is switched on, the vibration sensitivity is still unchanged.

From U.S. Pat. No. 5,451,891, it is for instance known to use an adaptive hysteresis that is dependent on the signal amplitude. In this case, a coupling factor is determined, as a quotient of the measured sensor amplitude and the frequency, and based on this coupling factor, the hysteresis is adjusted in proportion to the production of the coupling factor and the frequency. With this known method, only the behavior of passive sensors can be compensated for; such sensors furnish a very small signal for low excitation frequencies, and output a very high amplitude for high frequencies. However, the behavior of sensors that regardless of the signal frequency furnish a constant internal signal amplitude cannot be improved.

SUMMARY OF THE INVENTION

In a refinement of a method for detecting the motion of an element, in particular for detecting the direction of rotation of a rotatable element, relative to a sensor apparatus, with a detection of the direction of the motion, advantageously, as a function of the direction of motion, a measurement signal is increased or decreased at predetermined measurement intervals. Not until a predetermined threshold value is exceeded is a direction signal, preferably a direction-of-rotation signal, then generated.

In a simple way, by means of a counting logic circuit, a counter can then be increased by a binary amount in one direction, and the counter can be decreased by a binary amount in the other direction. Upon a detection of measurement signals which as a result of being increased or decreased in a measurement interval do not lead to exceeding of the predetermined amount of the threshold value, it can then be assumed that the element is vibrating.

A sensor apparatus which functions in accordance with the invention as a rule already has integrated detection of the direction of rotation, as is already the case for modern rpm sensors, such as so-called differential Hall sensors. Alternatively, however, other sensor technologies may be employed, such as so-called magnetoresistive or optical rpm sensors.

Detecting the direction of rotation is advantageously utilized according to the invention to make it possible simply and quickly to distinguish unambiguously between vibration and a genuine rotary motion. Unlike a rotary motion with measurement pulses in an unambiguous direction of rotation (such as left, left, left, et seq.), a rotary oscillation of a transducer wheel of the sensor apparatus is characterized by an alternating direction of rotation (such as right, left, right, left, et seq.).

Detecting vibration is achieved by the invention for instance by integration of the additional counter that has a sign, and this counter is incremented or decremented as a function of the value of the value of a direction of rotation bit. The output of a rpm sensor of this kind can be varied by the counter in such a way that the output is switched off as long as no unambiguous direction of rotation is detected, or in other words as long as the amount (without a sign preceding it) of the counter is below a threshold value which, depending on the desired immunity to vibration, is greater than or equal to two.

The above-described way of evaluating the preferable direction-of-rotation signal makes it possible in a simple way to detect vibration of a transducer wheel in the form of angular vibration and thus to improve the immunity of the sensor apparatus, without the necessity of increasing the hysteresis and thus worsening the resistance to major signal fluctuations.

In addition, however, the possibility also exists of using the method described in addition to a variable hysteresis, to achieve further improvement in the insensitivity to vibration. This is especially true for applications in which the mechanical structure already prevents the occurrence air gap impacts.

BRIEF DESCRIPTION OF THE DRAWINGS

One exemplary embodiment of the invention will be described in conjunction with the drawing. Shown are.

DETAILED DESCRIPTION OF THE PREFERRED EMBODIMENTS

Figure 1:
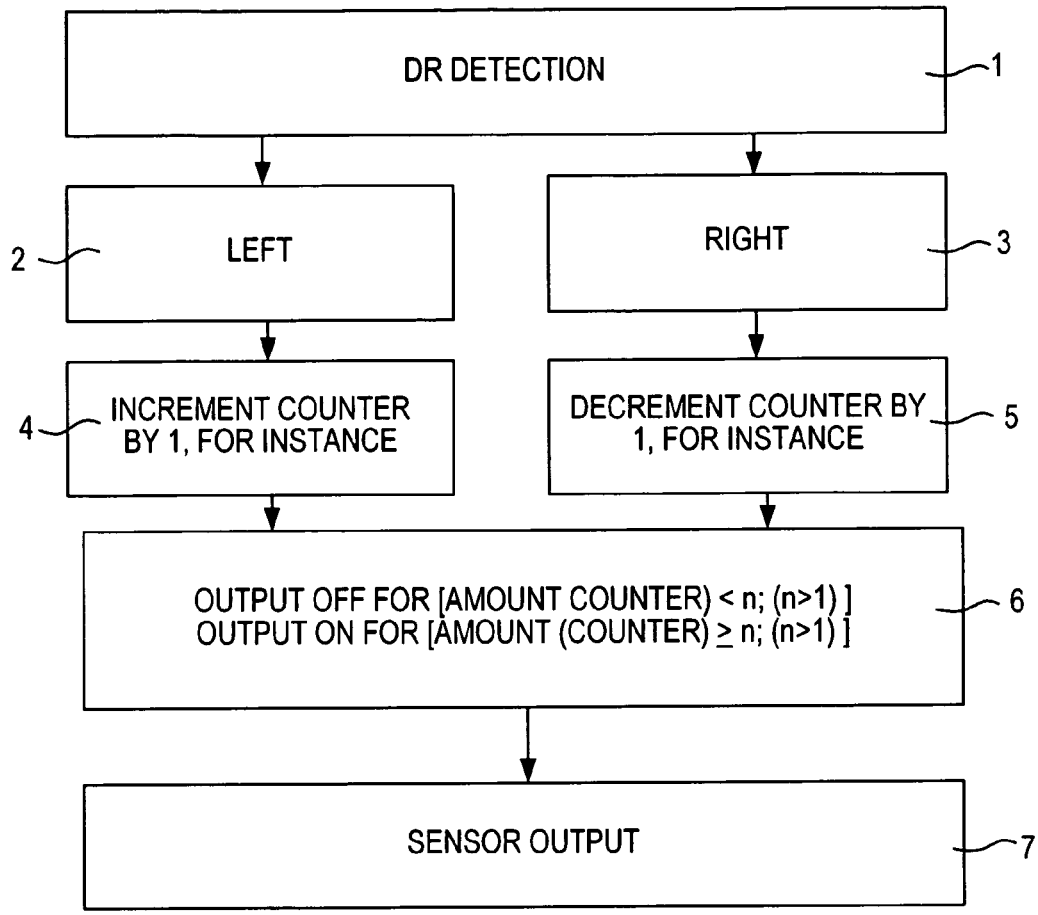
FIG. 1, a flow chart of a method for detecting the rotary motion of a transducer wheel relative to a sensor apparatus, with detection of the direction of rotation and with a counting logic component.

In FIG. 1, a flow chart is shown for a method for detecting the rotary motion of a transducer wheel, which in principle is known from the prior art, for instance for generating pulses for predetermined angles of rotation, relative to a sensor apparatus. In block 1, a direction of rotation detection circuit is represented symbolically; in block 2, this circuit generates a signal for the rotary motion "left", and in block 3 it generates a signal for the rotary motion "right".

In the exemplary embodiment of the invention described here, a binary counter state is increased by "1" in block 4 upon the detection of a leftward rotation, and decreased by "1" in block 5 upon detection of a rightward rotation. In a counting logic component 6, the respective counter state is ascertained and evaluated for a sensor output 7, as will be explained in conjunction with a graph shown in FIG. 2.

Figure 2:
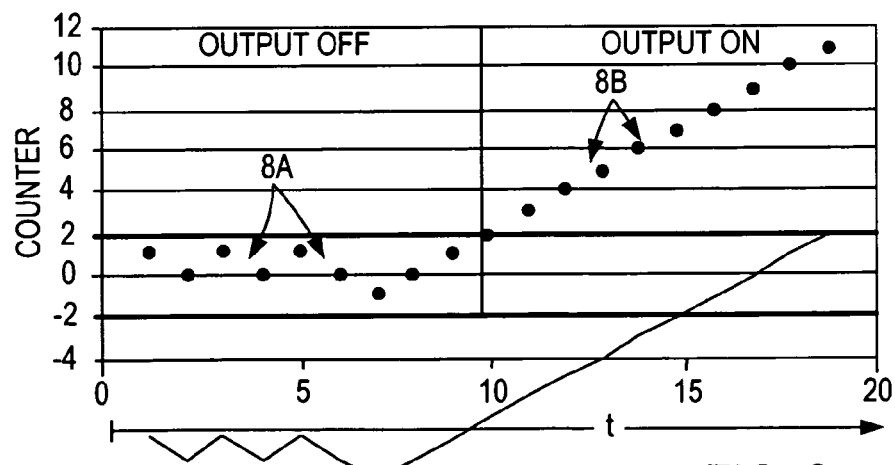
FIG. 2, a graph of the counting values of the counting logic component of FIG. 1.

FIG. 2 shows the course of the counter state in the counting logic component 6 over a measurement time t. The course of the counter state n over the time t, in the left-hand part of FIG. 2, shows the signature of a vibration 8a, which as a result of the change in direction of rotation initially fluctuates relatively often between 0 and +1 and briefly even extends to −1 and is thus within a threshold value of ±2. Within this range, vibration is thus detected, and the signal output 7 is switched off ("output off") on the basis of the condition: (amount (counter)<n, where n>1).

The course of the counter state n in the right-hand part of FIG. 2, conversely, shows an unambiguous direction-of-rotation signal 8b, which here ranges from −1 across the threshold value +2 to +11 and is thus outside the threshold value of ±2. Within this range, no vibration is thus detected, and the signal output is thus switched on ("output on") on the basis of the condition: (amount (counter)≧n, where n>1).

The detection of the direction of rotation shown in blocks 1 through 3 of FIG. 1 is thus advantageously utilized to generate an unambiguous sensor output signal 7 ("output on"; "output off"), which makes it possible to distinguish between vibration, in the left-hand part of the graph in FIG. 2, and a genuine rotary motion, in the right-hand part of the graph in FIG. 2.

The invention claimed is:

1. A method for detecting the motion of an element relative to a sensor apparatus, having
a detection of the direction of the motion, wherein as a function of the direction of motion. it is determined whether a vibration or a true rotational movement has occurred, wherein the vibration is recognized with alternating rotational direction and the true rotational movement is recognized with reference to multiple measurement impulses in a specific direction of rotation, wherein upon recognition of the true rotational movement, a direction-of-motion signal is generated and upon recognition of the vibration, output of the direction-of-motion signal is suppressed.

2. The method of claim 1, wherein by means of a counting logic circuit (6), a counter is increased by a binary amount in one direction (2), and in the other direction (3) the counter (6) is decreased by a binary amount; and wherein upon a detection of measurement signals which as a result of being increased or decreased in the measurement interval do not lead to exceeding of the predetermined amount of the threshold value, vibration of the element is detected.

3. The method of claim 1, wherein upon a detection of the measurement signals, for detecting the motion of the element, a variable hysteresis is additionally provided.

4. The method of claim 1, wherein for detecting the motion of a rotatable element, the direction of rotation is detected.

5. A sensor apparatus for performing a method of claim 1, wherein the sensor apparatus has contactless sensors, with which binary counting pulses (±1) can be generated at predetermined motion Intervals; and wherein an evaluation circuit includes a counting logic component (6), with which the counting pulses (±1) are countable, and if the predetermined amount is exceeded, a direction signal (7) can be generated, and otherwise, vibration of the element is detectable.

6. The sensor apparatus of claim 5, wherein the sensors include Hall elements.

7. The sensor apparatus of claim 5, wherein the sensor apparatus is used as a rpm sensor in a motor vehicle.

* * * * *